United States Patent [19]
Perry

[11] 3,988,601
[45] Oct. 26, 1976

[54] DATA PROCESSOR REORDER SHIFT REGISTER MEMORY

[75] Inventor: Richard Prather Perry, Haddon Heights, N.J.

[73] Assignee: RCA Corporation, New York, N.Y.

[22] Filed: Dec. 23, 1974

[21] Appl. No.: 535,806

[52] U.S. Cl. .................. 235/92 SH; 235/92 DP; 235/92 R; 235/152; 235/156; 340/172.5
[51] Int. Cl.² .................................. H03K 21/10
[58] Field of Search ......... 235/92 SH, 92 B, 92 ME, 235/92 MS, 92 CP, 92 CV, 92 DP, 92 LG, 92 PS, 152, 156, 181; 340/172.5; 445/1; 328/37

[56] References Cited
UNITED STATES PATENTS

| | | | |
|---|---|---|---|
| 3,266,022 | 8/1966 | Minnick et al. | 340/172.5 |
| 3,275,989 | 9/1966 | Glaser et al. | 340/172.5 |
| 3,371,320 | 2/1968 | Lachenmayer | 340/172.5 |
| 3,721,812 | 3/1973 | Schmidt | 235/156 |
| 3,766,534 | 10/1973 | Beausoleil et al. | 340/172.5 |
| 3,781,822 | 12/1973 | Ahamed | 340/172.5 |
| 3,783,258 | 1/1974 | Chwastyk | 235/156 |
| 3,810,112 | 5/1974 | Aho et al. | 340/172.5 |
| 3,816,729 | 6/1974 | Works | 235/156 |
| 3,866,023 | 2/1975 | Kadakia | 235/92 SH |
| 3,883,727 | 5/1975 | Stuart et al. | 235/152 |
| 3,943,347 | 3/1976 | Martinson | 235/152 |

*Primary Examiner*—Gareth D. Shaw
*Assistant Examiner*—John P. Vandenburg
*Attorney, Agent, or Firm*—Carl M. Wright; Edward J. Norton

[57] ABSTRACT

Shift register data reordering system for reordering serial input data to an output data sequence according to a desired schema, using varying length registers with selective gating.

7 Claims, 3 Drawing Figures

DATA PROCESSOR REORDER SHIFT REGISTER MEMORY

BACKGROUND OF THE INVENTION

This invention relates to shift register reorder memories for manipulating arrays. Array manipulations are often required when processing data. The time serial output signals for array processors often require reordering. An example of such an arrangement is cascaded Fast Fourier Transform (FFT) processor, which are cascaded to provide coarse and fine resolutions of frequency coefficients extracted from sample data in frequency surveillance or "zoom" systems.

The output signals from a first FFT processor are in bit-reversed order and are usually reordered for several reasons. For instance, in a step transform system, the successive output signals from the first FFT processor are processed diagonally by the second FFT processor. That is, the second FFT processor input signals are the first frequency coefficient in the first time frame, the second coefficient in the second time frame, and so on, from the first processor. The general input signal, $n$, to the second processor is the nth coefficient in the nth time frame from the first processor. The output signals from the first processor, whether in serial or parallel form, must be stored over successive time frames in order to provide the input signals to the second processor. The first complete set of input signals to the second processor is not available until n time frames have been sampled by the first processor.

Heretofore, a memory having $n^2$ storage locations has been used to store the output signals from the first processor for reordering as input signals to the second processor. The disclosed invention is a reordering shift register memory system with the minimum memory size of $n(n-1)/2$ locations.

BRIEF SUMMARY OF THE INVENTION

A reorder shift register receives input signals to be reordered. Shift signals are provided by clock signals. The reordering shift register includes a shift register for storing input signals between successive shift signals. An output switching means couples the input signals and the shift register output signals alternately to the output terminal of the reorder shift register in response to select signals from a controller. The controller provides the select signals in response to control signals and inactivates shift signals during the alternate select signals which couple the input signals to the output terminal.

DETAILED DESCRIPTION OF THE PREFERRED EMBODIMENT

Figure 1:
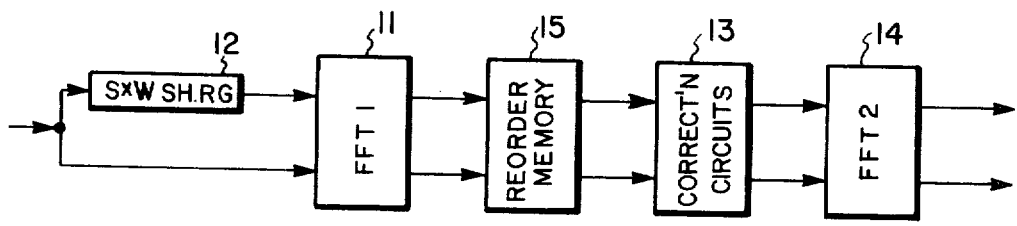
FIG. 1 is a block diagram of a system in which the invention is useful.

In FIG. 1, a first FFT processor 11 is used to process successive input samples. The input samples are complex numbers derived from sampled time domain signals to be analyzed in accordance with the well known butterfly diagram of the Cooley-Tukey Fast Fourier Transform algorithm. Accordingly, for 2s time domain sample points, the first s input samples must be stored in sequence before processing in the FFT processor 11 can begin. A shift register 12, capable of storing s data points, comprises w parallel shift registers, each of which is s bits long. The value of w is equal to the number of bits in a word. For purposes of illustration, the FFT processors 11 and 14 can be radix-two floating point FFT processors such as described in U.S. Pat. No. 3,800,130. For eight bit mantissas, the value of w in a floating point system is 22, i.e., the real and imaginary values each comprise eight information bits plus sign bits with a common four bit exponent.

In FIG. 1, when the first sample reaches the FFT processor 11 from the shift register 12, the $(s+1)$-th sample is available at the other input to the processor 11. The FFT processor 11 processes the information serially and generates successive output signals which are stored in a reorder memory 15.

Each sample group of 2s input samples is referred to as a time frame. Successive time frame samples are processed by the FFT processor 11 and stored in the reorder memory 15. For applications such as the processing of a step transform, described in more detail in application Ser. No. 357,198 by the same inventor and assigned to the same assignee, the signals from the reorder memory 15 are shifted out in a diagonal sequence for further processing by a second FFT processor 14. Correction circuits 13 can be provided for various purposes such as quadratic phase correction as explained in the above-referenced application. The output signals from the second FFT processor 14 are further processed in accordance with whatever procedure desired.

For purposes of illustration, an eight sample point system will be described. The concepts and principles can be applied to any desired size system, and where applicable, the general principle is given.

In an eight-sample pipe-line system, four sample times are required because two sample points are processed together in a radix-2 FFT processor. The output signals from the FFT processor can be viewed as constituting a square array. The successive columns represent successive time frames and the rows represent the coefficients from the FFT processor.

The FFT processors can be parallel organized producing all coefficients simultaneously. That is, with 2s sample points, 2s output signals will be produced in parallel. A parallel arrangement requires 2s parallel shift registers systems to reorder the data. In the illustrated embodiment which can be used with the floating point FFT processor in the above-identified patent, two parallel shift register arrangements are required because the pipe-line FFT processor produces two coefficients in parallel. One coefficient is identified as the sum (S-signal) and the other as the difference (D-signal) because they are produced by an adder and a subtracter, respectively.

The output coefficients—which are zero indexed—will be in bit-reversed order. The zero coefficient and the fourth coefficient are available first as the S- and D- signals, respectively. Next are the second and sixth coefficients. Therefore, during each time frame, the coefficients are shifted into the S-signal shift register in the following order: 0, 2, 1, 3; and into the D-signal shift register in the following order: 4, 6, 5, 7.

Two digits will be used to identify the signals in this disclosure, the first digit identifies the sample and the second digit identifies the time frame. Both are zero-indexed. The signals entering the S-signal shift register during the second time frame are, therefore, 01, 21, 11, and 31.

The first output diagonal will be comprised of the signals 00, 11, 22, 33, 44, 55, 66, and 77. The second diagonal will be comprised of the signals, 10, 21, 32, 43, 54, 65, 76, and 87. By using the signals in bit reversed input order to the second FFT processor, its resulting output coefficients will be in correct order.

The output diagonal signals from the S-signal shift register are, in the desired order for the first two diagonals, 00, 22, 11, 33, 10, 32, 21, 43. Correspondingly, the output diagonal signals from the D-signal shift register are 44, 66, 55, 77, 54, 76, 65, 71.

Four reordering shift registers 21–24 are used for the actual data reordering. A delay shift register 25 synchronizes the S-signals with the corresponding D-signals. A clock circuit 26 provides output pulses at the data rate. The S-input signals are coupled to the reordering shift register 21 and the D-input signals are coupled to the reordering shift register 23.

Figure 3:
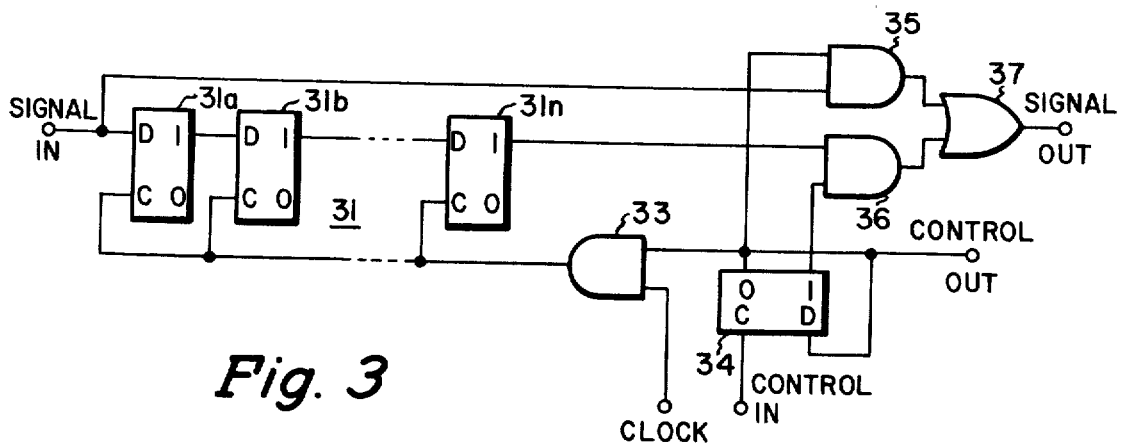
FIG. 3 is a detailed logic diagram of a reordering shift register.

The detailed configuration of a reordering shift register is shown in FIG. 3. It includes a conventional shift register 31 of $n$ stages 31$a$, 31$b$, . . ., 31$n$. The input signals are applied to the first stage 31$a$ and to an AND gate 35, the output signal of which is coupled to an input of an OR gate 37. The output of the shift register 31 from the stage 31$n$ is coupled to an AND gate 36 whose output signal provides another input signal to the OR gate 37. The output signal from the OR gate 37 is the output from the reordering shift register.

A control input signal is coupled to the clock input of a D-type flip-flop 34 which is feedback coupled to operate as a triggerable flip-flop. That is, each time an input control signal is applied, the flip-flop 34 changes state. The reset output signal from the flip-flop 34 is coupled as an input signal to an AND gate 33, the other input signal of which is the clock signal. The output signal from the AND gate 33 provides the shifting signal for the shift register 31. The reset output signal from the flip-flop 34 provides a control output signal. The complementary output signals from the flip-flop 34 are coupled to the AND gates 35 and 36 so that when the flip-flop 34 is reset, the output signal will be the input signal and when the flip-flop 34 is set, the output signal will be the signal stored in the last stage 31$n$ of the shift register 31.

Figure 2:
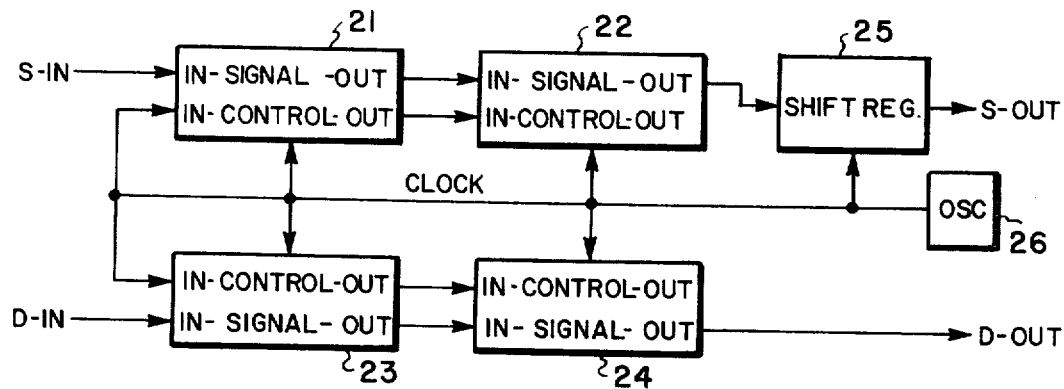
FIG. 2 is a block diagram of an embodiment of the invention using cascaded reordering shift registers.

As shown in FIG. 2, the reordering system is stepped by the clock circuit 26 which is coupled to all the shift registers 21–25. There are four stages in the reordering flip-flop circuits 21 and 23 for the eight sample point example above. The second reordering shift registers 22 and 24 each have two stages. The shift register 25 has sixteen stages and can be coupled to the S output signals as shown or at the S-signal input without altering the operation of the system. The S signals are passed through 16 additional stages in the shift register 25 to insure synchronization of the S and D output signals as will be shown below in more detail.

The control input signals to the first reordering shift registers 21 and 23 are the clock signal. The control output signals from the reordering shift registers 21 and 23 provide the control input signals for the next reordering shift registers 22 and 24, respectively.

As shown in FIG. 3, the shift signal to the shift register 31 is controlled by the control input signal and causes the shift register 31 to be shifted only by every other clock signal. The control output signal supplied to the following reorder shift register is at the half the clock rate and causes the flip-flops in the second reorder shift registers to the clocked by every fourth clock signal.

It is also seen in FIG. 3 that every other input signal to the shift register stage is coupled to the output signal by every other control input signal and the alternate input signals are shifted into the shift register 31. In the next successive reorder shift register, the same operation takes place at half the previous rate.

The flip-flop 34 in each reorder shift register can be eliminated if a ripple binary counter is provided. Each pair of corresponding reorder shift registers can be controlled by the same corresponding counter stage. The counter output signals would be coupled to the AND gate 36 and through an inverter to the AND gates 33 and 35. The lowest order counter stage (2°) would control the first reorder shift register 21 and 23. The next higher counter would control the next reorder shift registers 22 and 24. For systems having more stages, the successive stages are controlled by successively higher order counter stages. The delay shift register 25 is always driven directly by the clock since it must operate at the data rate.

The operation of the circuit illustrated in FIG. 2 is best illustrated by an example. Continuing the above eight sample point example, the input signals to the first stage of the S reorder shift register 21 are as follows: 00 02 01 03 10 12 11 13 20 22 21 23 30 32 31 33 40 42 41 43 50 52 51 53 60 62 61 63 70 72 71 73 80 82 81 83. Every other signal is shifted into the shift register and every alternate signal is passed directly to the second register 22. Similarly, the input signals to the first reorder shift register 23 for the D signals are as follows: 04 06 05 07 14 16 15 17 24 26 25 27 34 36 35 37 44 46 45 47 54 56 55 57 64 66 65 74 76 75 77 84 86 85 87.

The output signals from the shift register in the first signal reorder shift register 21, i.e., the output signals from the stage 31$n$ shown in FIG. 3, will be as follows for each time pulse: 00 00 01 01 10 10 11 11 20 20 21 21 30 30 31 31 40 40 41 41 50 50 51 51 60 60 61 61 70 70 71 71 80 80 81 81. It can be seen that each signal is at the output for two successive time periods due to the shifting at half the clock rate and that only every other input signal is shown. Similarly, the output signals in the first D signal reorder shift register 23 are as follows: 04 04 05 05 14 14 15 15 24 24 25 25 34 34 35 35 44 44 etc.

The output signal from the first reorder shift 21 will be as follows: 00 22 01 23 10 32 11 33 20 42 21 43 30 52 31 53 40 62 41 63 50 72 51 73 60 82 61 83.

The above output sequence is shown beginning at the ninth clock signal because the shift register in the first reorder shift register 21 is initially empty so that eight time pulses pass before a significant signal is produced at its output. The skipped signals represent data below the first diagonal which are discarded. It can be seen from the above sequence that every other signal is produced at the output interlaced with every other signal beginning at the tenth sample. Similarly, the output signals from the D signal first shift registers 23 are as follows: 04 26 05 27 14 36 15 37, etc. The sequence need not be completely shown since the pattern is clear.

The output signals from the first reorder shift registers 21 and 23 are applied as the input signals to the second reorder shift registers 22 and 24. Since the control signals from the first registers 21 and 23 are at one half the clock rate, the internal operation of the second reorder shift register 22 and 24 proceeds at one-fourth the clock rate. Applying the same sequence of operations to the second stages, the output signals from the second reorder shift register 22 are as follows: 00 22 11 33 10 32 21 43 20 42 31 53 30 52 41 63 40 62 51 73 50 72 61 83. Similarly, the output signals from the second D signal reorder shift register 24 are: 04 26 15 37 14 36 25 47 24 46 35 57 34 56 45 67 44 66 55 77 54 76 65 87.

The first eight signals from the S signal reorder shift register 22 are the desired output signal for the first and second diagonals and, correspondingly, the last eight signals from the D signal reorder shift register 24 are the desired D signal diagonal output signals. The desired diagonal output signals, however, are temporally separated by sixteen clock pulses. Therefore, delaying the output signal from the second S signal reorder shift register 22 by 16 time pulses will bring the diagonal output signals from the S signal reorder shift register 22 into proper time coincidence with the desired diagonal output signals from the D signal reorder shift register 24. Therefore, the 16 stage shift register 25 delays the signals from the output of the S signal reorder shift register 22 so that the S and D output signals are in correct time relation.

In the block diagram of the embodiment of the invention shown in FIG. 2, each shift register is actually a plurality of parallel stages, each stage being identical to the stage described in connection with FIG. 3. The number of stages in parallel is determined by the number of bits in single coefficient word. For example, in the radix-2 FFT processor described in the above-identified patent, each word comprises 22 bits as noted above.

The number of sample points and resulting coefficients in a radix-2 system is an integral power of 2. Denoting the number of sample points as $2^m$, the number of stages in the delay shift register 25 is $2^{2m-2}$. The number of reorder shift registers required is $m-1$. The number of stages in the first reorder shift register is $2^{2m-4}$, each successive one of the remaining $m-2$ shift registers requires half the number of stages as its preceding shift register. For the eight sample point case described in the example to explain the operation of the embodiment of the invention, the number of stages in the delay shift register 25 was, since $2^3 = 8$, $2^{2x3-2} = 2^4 = 16$. The number of reorder shift registers is $3-1=2$ and the number of stages in the first reorder shift register is $2^{2x3-4} = 2^2 = 4$. The number of stages in the reorder shift registers determines the value of n described in connection with FIG. 3. Otherwise, all the stages are identical.

The invention described is a system for reordering the output coefficients from a first FFT processor for processing by a second FFT processor. Various modifications to the system and circuits described and illustrated to explain the concepts of and the modes for practicing the invention might be made by those of ordinary skill in the art within the principles or scope of the invention as expressed in the appended claims.

What is claimed is:

1. A reordering shift register comprising the combination of:
    input signal means for receiving signals to be reordered;
    clock signal input means for providing shift signals;
    shift register means for storing input signals between successive shift signals, and having output means;
    output switching means responsive to select signals and having an output terminal;
    means for coupling the input signal means to said output switching means;
    means for coupling the output means of the shift register means to said output switching means;
    control means responsive to a control signal for producing said select signals to operate said output switching means to couple alternatively during control signal times said input signal means and said output means of the shift register means to said output terminal; and
    means operated by said control means for disabling said clock signal input means during the alternate select signals which operate said output switching means to couple said input signal means to said output terminal.

2. The invention as claimed in claim 1 wherein said control means comprises a stage in a ripple binary counter responsive to said clock input signal.

3. The invention as claimed in claim 1 wherein said control means includes a triggerable flip-flop having complementary output select signals and an input means for receiving said control signal.

4. The invention as claimed in claim 3 wherein said clock signal input means includes a gating means responsive to a select signal produced by said flip-flop.

5. A data reordering system comprising the combination of:
    input means for receiving the signals representing the data to be reordered;
    clock signal means for producing timing signals at a frequency equal to the input data signal rate; and
    a plurality of reordering shift register means coupled in cascade, each of said reordering shift register means including control means responsive to a control signal from the preceding reordering shift register means for applying said timing signals as shift signals to that shift register means in response to alternate control signals and for passing the data signals around that shift register means in response to remaining alternate control signals and for producing a control signal to the following reordering shift register means, the control signal for the first reordering shift register means being derived from said clock signal means, the first reordering shift register means being coupled to said input means.

6. The invention as claimed in claim 5 wherein said control signals are derived from stages of a binary ripple counter responsive to said clock signal means.

7. The invention as claimed in claim 5 further including:
    a second plurality of reordering shift register means for processing second data signals; and
    delay means for synchronizing the output data signals from said pluralities of reorder shift register means.

* * * * *